United States Patent
Lee et al.

(10) Patent No.: US 11,649,384 B2
(45) Date of Patent: May 16, 2023

(54) METHOD FOR SELECTING ADHESIVE WITH EXCELLENT FOLDING STABILITY

(71) Applicant: LG CHEM, LTD., Seoul (KR)

(72) Inventors: Hyunsup Lee, Daejeon (KR); Hyon Gyu Park, Daejeon (KR); Yoonkyung Kwon, Daejeon (KR); Myunghan Lee, Daejeon (KR); Hee Song, Daejeon (KR)

(73) Assignee: LG CHEM, LTD., Seoul (KR)

( * ) Notice: Subject to any disclaimer, the term of this patent is extended or adjusted under 35 U.S.C. 154(b) by 800 days.

(21) Appl. No.: 16/478,408

(22) PCT Filed: Aug. 23, 2018

(86) PCT No.: PCT/KR2018/009727
§ 371 (c)(1),
(2) Date: Jul. 16, 2019

(87) PCT Pub. No.: WO2019/050195
PCT Pub. Date: Mar. 14, 2019

(65) Prior Publication Data
US 2019/0376884 A1    Dec. 12, 2019

(30) Foreign Application Priority Data

Sep. 11, 2017 (KR) .......... 10-2017-0116016

(51) Int. Cl.
*G01N 3/20* (2006.01)
*G01N 3/00* (2006.01)
(Continued)

(52) U.S. Cl.
CPC ....... *C09J 133/08* (2013.01); *C08F 220/1804* (2020.02); *C08F 220/1808* (2020.02);
(Continued)

(58) Field of Classification Search
CPC .. C09J 133/08; C09J 201/00; C09J 2301/312; G01N 3/00; G01N 3/20; G06F 7/544;
(Continued)

(56) References Cited

U.S. PATENT DOCUMENTS 6,410,673 B1   6/2002   Arai et al.
9,261,444 B1*   2/2016   Sutherland ............... G01N 3/30
(Continued)

FOREIGN PATENT DOCUMENTS

JP    2000-275154 A    10/2000
JP    2007-113944 A    5/2007
(Continued)

OTHER PUBLICATIONS

Office Action issued for European Patent Application No. 18 854 897.8 dated Aug. 9, 2021, 6 pages.
(Continued)

*Primary Examiner* — Stephanie E Bloss
(74) *Attorney, Agent, or Firm* — Rothwell, Figg, Ernst & Manbeck, P.C.

(57) ABSTRACT

The present invention relates to a method of deriving significant factors of rheological properties, which influence folding stability for developing an adhesive with excellent folding stability, and predicting folding stability through the same. It is possible to select an adhesive with excellent folding stability by measuring initial stress and a strain recovery rate as the significant factors, and measuring predicted folding stability (predicted number of times of folding) therefrom.

3 Claims, 1 Drawing Sheet

(51) Int. Cl.
- *C09J 133/08* (2006.01)
- *H01L 51/00* (2006.01)
- *C09J 201/00* (2006.01)
- *C08F 220/18* (2006.01)
- *G01N 3/08* (2006.01)
- *G06F 7/544* (2006.01)
- *G09F 9/30* (2006.01)

(52) U.S. Cl.
CPC .............. *C09J 201/00* (2013.01); *G01N 3/00* (2013.01); *G01N 3/08* (2013.01); *G01N 3/20* (2013.01); *G06F 7/544* (2013.01); *H01L 51/0097* (2013.01); *C09J 2301/312* (2020.08); *G09F 9/301* (2013.01); *H01L 2251/5338* (2013.01); *H01L 2924/078* (2013.01)

(58) Field of Classification Search
CPC ......... H01L 51/0097; H01L 2251/5338; G09F 9/301
See application file for complete search history.

(56) References Cited

U.S. PATENT DOCUMENTS

| | | | |
|---|---|---|---|
| 2013/0136874 A1 | 5/2013 | Xia et al. | |
| 2017/0015880 A1* | 1/2017 | Kim | C09J 7/22 |
| 2017/0166786 A1 | 6/2017 | Moon et al. | |
| 2019/0062608 A1 | 2/2019 | Lesuffleur et al. | |
| 2019/0376884 A1 | 12/2019 | Lee et al. | |
| 2019/0391312 A1 | 12/2019 | Hikita et al. | |

FOREIGN PATENT DOCUMENTS

| | | | | |
|---|---|---|---|---|
| JP | 2013-542455 A | | 11/2013 | |
| JP | 2015-190847 A | | 11/2015 | |
| JP | 2017-102443 A | | 6/2017 | |
| JP | 2018-524425 A | | 8/2018 | |
| JP | 2022063198 A | * | 4/2022 | |
| KR | 10-2013-0130698 A | | 12/2013 | |
| KR | 10-2016-0093803 A | | 8/2016 | |
| KR | 10-2016-0100122 A | | 8/2016 | |
| KR | 10-2016-0129388 A | | 11/2016 | |
| KR | 10-2017-0070370 A | | 6/2017 | |
| KR | 10-2017-0097851 A | | 8/2017 | |
| KR | 10-2017-0097854 A | | 8/2017 | |
| WO | 2000-023484 A1 | | 4/2000 | |
| WO | 2012-024217 A1 | | 2/2012 | |
| WO | 2016-196576 A1 | | 12/2016 | |
| WO | WO-2016196458 A2 | * | 12/2016 | ............. B32B 25/14 |
| WO | WO-2021025475 A1 | * | 2/2021 | ............. C08F 220/06 |

OTHER PUBLICATIONS

Kim, Hyorin, et al., "Improvement of Bending Recovery of Polyester Film via Physical Aging Treatment", Polymer (Korea), vol. 39, No. 4, pp. 593-600 (2015).

International Search Report issued for International Application No. PCT/KR2018/009727 dated Mar. 19, 2019, 4 pages.

* cited by examiner

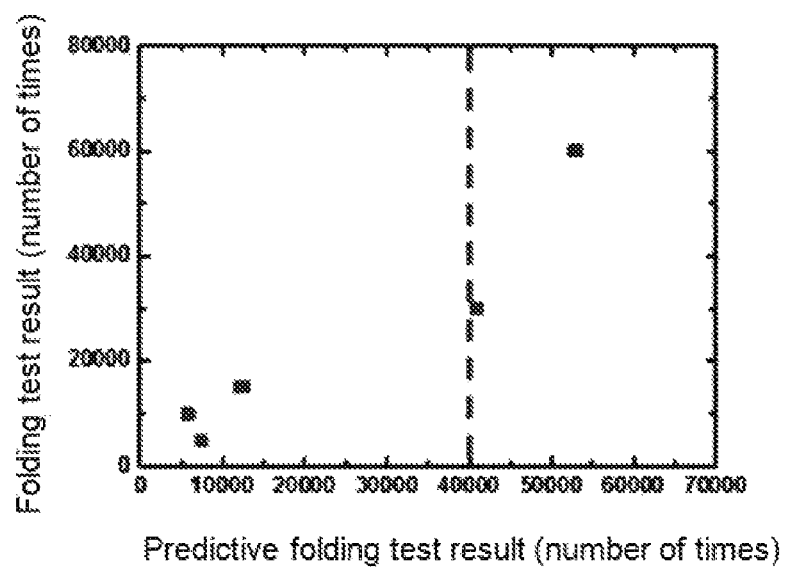

METHOD FOR SELECTING ADHESIVE WITH EXCELLENT FOLDING STABILITY

TECHNICAL FIELD

The application is a 35 U.S.C. § 371 National Phase Entry Application from PCT/KR2018/009727, filed on Aug. 23, 2018, and designating the United States, which claims the benefits of priority to Korean Patent Application No. 10-2017-0116016, filed Sep. 11, 2017, the disclosures of which are incorporated herein by reference in their entireties for all purposes.

The present invention relates to a method for selecting an adhesive suitable for a foldable display. More specifically, it relates to a method for predicting the folding stability of an adhesive, which affects the folding stability of a foldable display.

BACKGROUND ART

A foldable display such as an organic light emitting display has flexibility, and therefore, it can be made into a foldable device for portable convenience.

However, even with such a flexible display, repeated folding and unfolding for a long period of time may cause a deformation problem. In the foldable display exposed to such repeated deformation conditions, the adhesive used in the display is also exposed to the same repeated deformation conditions unlike the conventional adhesive. Therefore, it is necessary to develop a foldable display as well as an adhesive.

With regard to the development of such adhesive, it is not easy to secure suitable physical properties, and it is very important to understand which physical properties are important factors. In order to solve this problem, a method for identifying the major physical properties of an adhesive which affect the folding stability of the foldable display and then predicting the folding stability therefrom was required.

In this regard, it has been found that the method for predicting the folding stability of the adhesive used in a foldable display can be developed through the following procedure:

(i) Evaluating rheological property of adhesives made of various composition;
(ii) Matching with folding stability evaluation results evaluated in actual panel form;
(iii) Deriving significance factors of rheological property related to folding stability; and
(iv) Inducing an equation for predicting folding stability by using the significance factors of rheological property.

However, so far, there has been no satisfactory result for the factors of the adhesive related to folding stability and the equation for predicting folding stability.

The present inventors have derived factors that are highly related to important physical properties of foldable display adhesive and have found that the folding stability can be predicted from the factors.

DISCLOSURE

Technical Problem

In order to solve the above problems in the art, an object of the present invention is to derive significance factors of rhetological property which affect to folding stability of an adhesive, and to predict the folding stability of an adhesive through the factors in order to develop an adhesive having excellent folding stability.

Technical Solution

According to the prior art, the physical property of the shear direction was mainly used for evaluating physical properties of the existing adhesive for a foldable display, but the present inventors confirmed that this is not suitable for the adhesive for a foldable display. This is because the strain during folding mainly occurs in the stretching direction. Therefore, it is confirmed that the evaluation result of the stretching property by using a dynamic mechanical analyzer (DMA) is related to the actual folding test results. Further, the present inventors combined the two highly relevant significance factors derived from the result and then induced an equation for predicting folding stability.

In order to achieve one object, in one embodiment, the present invention provides a method for deriving the significance factors of rheological property which affect the folding stability of an adhesive, and predicting the folding stability of an adhesive from the factors to select an adhesive having excellent folding stability.

In one embodiment, the significance factors of rheological property may be initial stress and strain recovery.

In one embodiment, the present invention provides a method for selecting an adhesive suitable for a foldable display, comprising measuring initial stress and strain recovery of the adhesive by using a dynamic mechanical analyzer (DMA) in the stretching property measurement (Stress Relaxation & Recovery) of the adhesive, and then calculating the predictive folding stability value of the adhesive from the measured values by using Equation 1 below:

$$\text{Predictive folding stability} = 1.587 \times 10^{19} (\text{Strain recovery}^{-4.722})(\text{Initial stress}^{-1.304}) \qquad [\text{Equation 1}]$$

In one embodiment, the stretching property of an adhesive can be measured by using DMA at a strain of 12% at a temperature of −20° C. for the strain time of 10 min and the recovery time of 20 min. These conditions may vary depending on experiments, and the strain time and the recovery time can usually be set so that the recovery time is at least twice of the strain time.

In one embodiment, the predictive folding stability value (predictive folding number) may be 40000 or more. The folding stability is a value obtained by combination of two factors of the initial stress and the strain recovery, and it is not predicted by only one factor of the two factors. The initial stress and the strain recovery are values that cause the predictive folding stability value to be 40000 or more. In one embodiment, the initial stress may be 7000 Pa to 25000 Pa, and the strain recovery may be 70% to 99%. In another embodiment, the initial stress may be 12000 Pa to 20000 Pa, for example, 12000 Pa to 15000 Pa, and the strain recovery may be 80% to 90%, for example, 80% to 87%.

In one embodiment, the Pearson correlation coefficient between the folding stability and the combined factors of the initial stress and the strain recovery is 0.95.

Advantageous Effects

According to the present invention, an adhesive having excellent folding stability can be selected by measuring the initial stress and the strain recovery as physical property factors of an adhesive for a foldable display and then calculating the folding stability therefrom, thereby increasing the prediction accuracy of the folding stability.

DESCRIPTION OF DRAWINGS

FIG. 1 shows the relationship between the predictive folding stability calculated from the measured values of the initial stress and the stain recovery of an adhesive by using a dynamic mechanical analyzer (DMA) and the actual folding stability, and the Pearson correlation coefficient between the predictive value and the experimental value is 0.95.

BEST MODE CARRYING OUT THE INVENTION

Hereinafter, embodiments of the present invention will be described in more detail.

It should be understood that the terms and words used in the specification and claims are not to be construed as having common and dictionary meanings, but are construed as having meanings and concepts corresponding to the spirit of the invention in view of the principle that the inventor can define properly the concept of the terms and words in order to describe his/her invention with the best method.

The present invention is objected to derive significance factors of rhetological property which affect to folding stability of an adhesive, and to accurately predict the folding stability of an adhesive in order to develop an adhesive having excellent folding stability.

In order to achieve the object, the present invention provides a method for selecting an adhesive suitable for a foldable display by measuring initial stress and strain recovery of the adhesive using a dynamic mechanical analyzer (DMA) in the stretching property measurement (Stress Relaxation & Recovery) of the adhesive, and then calculating the predictive folding stability value of the adhesive from the measured values by using Equation 1 below:

Predictive folding stability=$1.587 \times 10^{19}$(Strain recovery$^{-4.722}$)(Initial stress$^{-1.304}$)     [Equation 1]

In one embodiment, the stretching property of the adhesive can be measured by using DMA at a strain of 12% at a temperature of −20° C. for the strain time of 10 min and the recovery time of 20 min. These conditions may vary depending on experiments, and the strain time and the recovery time can usually be set so that the recovery time is at least twice of the strain time In one embodiment, the predictive folding stability value (predictive folding number) may be 40000 or more. The folding stability is a value obtained by combination of two factors of the initial stress and the strain recovery, and it is not predicted by only one factor of the two factors. The initial stress and the strain recovery are values that cause the predictive folding stability value to be 40000 or more. In one embodiment, the initial stress may be 7000 Pa to 25000 Pa, and the strain recovery may be 70% to 99%. In another embodiment, the initial stress may be 12000 Pa to 20000 Pa, for example, 12000 Pa to 15000 Pa, and the strain recovery may be 80% to 90%, for example, 80% to 87%.

In one embodiment, the Pearson correlation coefficient between the folding stability and the combined factors of the initial stress and the strain recovery is 0.95.

MODE FOR INVENTION

Hereinafter, the present invention is explained by the following examples in more detail. The following examples are intended to further illustrate the present invention. Accordingly, those of ordinary skill in the art will recognize that various changes and modifications of the embodiments described herein can be made without departing from the scope and spirit of the invention.

EXAMPLE

In this Example, the selection of a suitable adhesive by measuring the stretching property of an adhesive for a foldable display and predicting the folding stability therefrom will be described in detail.

(1) Preparation of Sample

Six kinds of adhesive samples having the following composition (weight ratio) were prepared.

Sample A: Ethylhexyl acrylate (EHA) 98, acrylic acid (AA) 2, citric acid (CA)(cross-linking agent) 0.03

Sample B: EHA 98, AA 2, CA 0.5

Sample C: EHA 94, AA 6, CA 0.03

Sample D: EHA 97.5, AA 2.5, CA 0.03

Sample E: Butyl acrylate (BA) 98, AA 2, CA 0.03

Sample F: BA 94, AA 6, CA 0.03

(2) Conditions for Measuring Stretching Property of Adhesive (DMA, Stress Relaxation & Recovery)

The six kinds of the adhesive samples were subjected to an actual folding test under the following conditions to measure the stretching property of each sample.

Temperature: −20° C.

Strain: 12%

Time: Strain 10 min, Recovery 20 min (3) Derivation of Significance Factors of Rheological Property As the significance factors of rheological property related to the folding stability, the initial stress and the strain recovery were derived through Stress Relaxation test by using DMA.

(4) Prediction of Folding Stability

As the significance factors of rheological property, the initial stress and the strain recovery were combined and the predictive folding stability value was calculated according to Equation 1 below:

Predictive folding stability=$1.587 \times 10^{19}$(Strain recovery$^{-4.722}$)(Initial stress$^{-1.304}$)     [Equation 1]

The correlation coefficient between the predictive folding stability calculated from the measured values of the initial stress and the stain recovery of the adhesive samples by using DMA and the actual folding stability thereof was confirmed. It was found that the Pearson correlation coefficient between the folding stability and the combined factors of the initial stress and the strain recovery was 0.95.

The actual folding test results (number of times) and the predictive folding test results (number of times) of the 6 adhesive samples were shown in Table 1 below.

TABLE 1

| Adhesive sample | Actual folding number | Predictive folding number | Strain recovery | Initial stress | Suitability |
|---|---|---|---|---|---|
| A | 60000 | 53000 | 85.2 | 12941 | ○ |
| B | 15000 | 13000 | 99.8 | 21987.1 | X |
| C | 15000 | 12000 | 88.4 | 35099.7 | X |
| D | 30000 | 41000 | 86.6 | 14864.7 | ○ |
| E | 5000 | 7000 | 93.9 | 40874.3 | X |
| F | 10000 | 6000 | 95.3 | 47026.2 | X |

Based on the above table, it can be found that the adhesive samples A and D having the folding stability value of 40000 or more are excellent adhesives. Accordingly, an adhesive having excellent folding stability can be selected by calculating the folding stability value from the initial stress and strain recovery values of adhesives for a foldable display adhesives according to the method of the present invention.

Although specific embodiments of the present invention are described in detail as described above, it will be apparent to those skilled in the art that the specific description is merely desirable exemplary embodiment and should not be construed as limiting the scope of the present invention. Therefore, the substantial scope of the present invention is defined by the accompanying claims and equivalent thereof.

The invention claimed is:

1. A method for selecting an adhesive having folding stability, comprising:
    measuring an initial stress and a strain recovery of the adhesive by using a dynamic mechanical analyzer (DMA) to select the adhesive,
    wherein the initial stress is 7000 to 25000 Pa, and the strain recovery is 70% to 99%, and
    wherein the selected adhesive has a predictive folding stability value of 40,000 or more according to Equation 1 below:

$$\text{Predictive folding stability} = 1.587 \times 10^{19} (\text{Strain recovery}^{-4.722})(\text{Initial stress}^{-1.304}) \quad [\text{Equation 1}].$$

2. The method for selecting an adhesive having excellent folding stability according to claim 1, wherein the initial stress is 12000 to 15000 Pa, and the strain recovery is 80% to 87%.

3. The method for selecting an adhesive having excellent folding stability according to claim 1, wherein Pearson's correlation coefficient between the folding stability and a combination of the initial stress and the strain recovery is 0.95.

* * * * *